United States Patent [19]
Tahim

[11] Patent Number: 5,265,268
[45] Date of Patent: Nov. 23, 1993

[54] IMAGE RECOVERY MIXER

[75] Inventor: Raghbir S. Tahim, Buena Park, Calif.

[73] Assignee: Hughes Aircraft Company, Los Angeles, Calif.

[21] Appl. No.: 692,412

[22] Filed: Apr. 29, 1991

[51] Int. Cl.$^5$ ............................................. H04B 1/26
[52] U.S. Cl. .................................... 455/328; 455/317; 333/250
[58] Field of Search ............... 455/323, 328, 326, 317, 455/302, 313; 333/248, 250, 125, 126, 137, 135

[56]  References Cited
U.S. PATENT DOCUMENTS

| | | | |
|---|---|---|---|
| 3,562,651 | 2/1971 | Hoover et al. | 455/323 |
| 3,681,697 | 8/1972 | Moroney | 455/326 |
| 4,188,584 | 2/1980 | Hoogstraate | 455/328 |
| 4,654,887 | 3/1987 | Murphy et al. | 455/327 |

Primary Examiner—Reinhard J. Eisenzopf
Assistant Examiner—Nguyen Vo
Attorney, Agent, or Firm—Gordon R. Lindeen, III; Wanda K. Denson-Low

[57] ABSTRACT

A microwave mixer is formed of three orthogonally oriented waveguides, each having a rectangular cross-section defined by a pair of opposed broad walls and a pair of opposed sidewalls wherein the ratio of cross-sectional dimensions typically is 2:1. The mixer includes an input coupling probe, a mixing region, and an output filter disposed serially along a first of the waveguides. A second of the waveguides applies a reference LO signal via the probe to the mixing region, the mixing region including at least one diode with two diodes being employed in the preferred embodiment of the invention. A section of dielectric board serves to support the diodes of the mixing region, components of the filter, and the probe in the first waveguide. The third waveguide applies an RF input signal to the mixing region via an input port in a side of the first waveguide, and via an impedance matching taper and a waveguide section of reduced height which impedes egress of both an IF and an image signal produced in the mixing region by interaction of the LO and the RF signals. The filter is located at the mixer IF output port for reflecting an image-frequency signal back to the diodes of the mixing region for further interaction with the LO signal to generate additional IF signal in phase with the originally produced IF signal for additional power and a significantly higher signal-to-noise ratio.

9 Claims, 2 Drawing Sheets

IMAGE RECOVERY MIXER

BACKGROUND OF THE INVENTION

This invention relates to an electromagnetic microwave mixer, suitable for operation in the millimeter wave region of the spectrum for mixing a received RF (radio frequency) signal with a reference LO (local oscillator) signal to produce an IF (intermediate frequency) signal and, more particularly, to a mixer producing an image signal in addition to the IF signal and having a microwave filter for reflecting the image signal back into a diode mixing region for further interaction with the LO signal to boost IF power while reducing mixer conversion loss for improved SNR (signal-to-noise ratio).

Low noise millimeter-wave receivers are employed generally in communication and radar systems suitable for electronic warfare, surveillance, radiometry, and instrumentation. It is the practice in the construction of such receivers to employ a mixer without an amplifier at the RF input port of the mixer. Therefore, mixer conversion loss determines sensitivity of the receiver. A reduction of the mixer conversion loss at the front end of the receiver improves the noise figure of the receiver. Therefore, the construction of the mixer is most significant in determining the overall performance of the system.

By way of example, low noise mixer circuits are important in millimeter-wave receiver systems operating in spectral regions, or windows, at 35 and 94 GHz (gigahertz) for use in certain radars, a spectral region at 60 GHz employed for satellite communication, and regions at 140 and 180 GHz employed in radiometric measurements. All of these applications require a receiver with a low noise front end for optimizing performance of the system.

A problem arises in that most of the millimeter-wave mixers developed in recent years have a much higher conversion loss than is desired due essentially to the dissipation of RF power at an image frequency, as well as RF and IF mismatch losses in power and parasitic losses in power. It has been observed that a capturing of power at the image frequency to generate more IF power would produce greater efficiency of a mixer circuit. However, a realization of such power capture at the image frequency has been hampered by losses associated with narrow band filters which might possibly be employed in an RF circuit to retrieve power of the image signal.

SUMMARY OF THE INVENTION

The aforementioned problem is overcome and other advantages are provided by a mixer employing a filter at the mixer IF output port, in accordance with the invention, for reflecting an image-frequency signal back into a diode mixing region of the mixer for further interaction with a reference LO signal to regenerate additional IF signal in phase with the originally produced IF signal. This construction of mixer avoids the need for a narrow band filter in the RF circuit to retrieve power from the image signal, and provides for a capturing of the additional power for a significant reduction in mixer conversion loss and a significantly higher signal-to-noise ratio.

In the preferred embodiment of the invention, three orthogonally oriented waveguides are employed in the construction of the mixer. Each of the waveguides has a rectangular cross-section defined by a pair of opposed broad walls and a pair of opposed sidewalls wherein the ratio of cross-sectional dimensions typically is 2 : 1. To facilitate description of the construction, it is convenient to define a central plane in each of the waveguides, the central plane extending longitudinally along the waveguide axis and being parallel to the broad walls.

A first one of the waveguides includes components of a diode mixer region and a mixer IF output port as well as a reference input LO port. A section of dielectric board is disposed in the first waveguide along the central plane and serves to support diodes of the mixing region, components of a filter in the IF output port, and a probe in the reference input port for guiding the reference signal to the mixing region. The filter in the IF output port allows for propagation of the IF signal from the mixing region through the IF output port while reflecting an image signal at an image frequency, produced by the mixing operation, back to the diodes of the mixing region for interaction with the reference signal. The interaction of the image signal with the reference signal produces additional IF signal in phase with the originally produced IF signal for increased output power, increased SNR, and reduced mixer conversion loss.

A second one of the waveguides is mounted to the first waveguide with the central plane of the second waveguide being parallel to the central plane of the first waveguide. The sidewall of the second waveguide abuts an end of the first waveguide at the site of the reference input port, with the longitudinal axes of the first and the second waveguides being perpendicular to each other. A coupling region developed within the sidewall of the second waveguide and the end portion of the first waveguide includes the probe for coupling the reference LO signal, delivered by the second waveguide, into the mixing region of the first waveguide. An end of the third waveguide abuts a broad wall of the first waveguide at the site of the mixing region.

The third waveguide is oriented relative to the first waveguide such that the central plane of the third waveguide is perpendicular to the central plane of the first waveguide, and such that the longitudinal axis of the first waveguide lies in the central plane of the third waveguide. A port in the broad wall of the first waveguide receives the RF input signal delivered by the third waveguide to the mixing region. The third waveguide includes a taper and a reduced cross-sectional region of waveguide which communicates with the port in the broad wall of the first waveguide for matching impedance of the RF input signal to the impedance of the mixing region. The reduced cross-sectional region of the third waveguide acts as a waveguide below cut-off frequency to signals produced in the mixing region at both the intermediate frequency and the image frequency. Thereby, the image frequency signal is essentially trapped in the first waveguide so as to facilitate a reflection of the image signal by the filter back to the mixing diodes for interaction with the reference LO signal.

BRIEF DESCRIPTION OF THE DRAWING

The aforementioned aspects and other features of the invention are explained in the following description, taken in connection with the accompanying drawing wherein.

DETAILED DESCRIPTION

Figure 1:
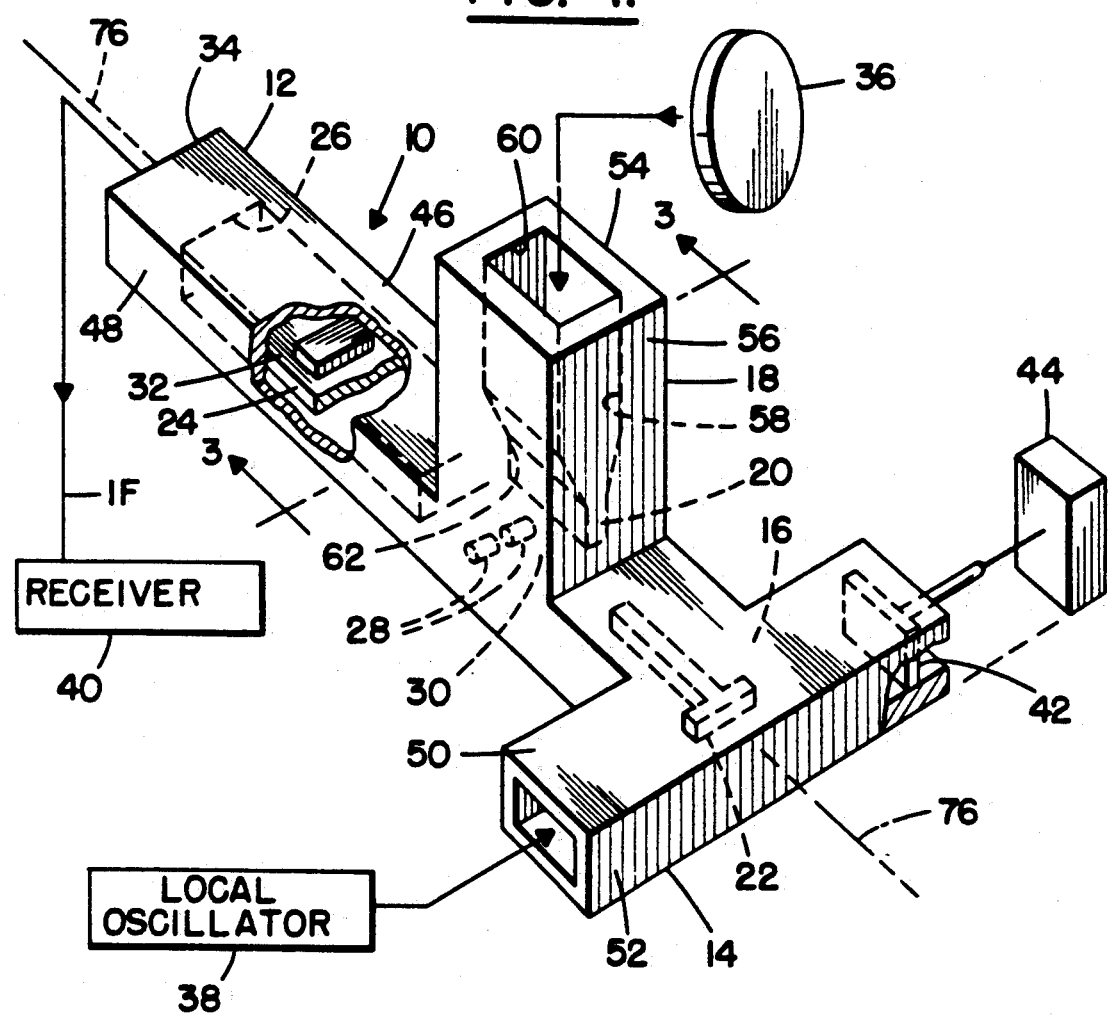
FIG. 1 is a stylized perspective view of the mixer of the invention.
Figure 2:
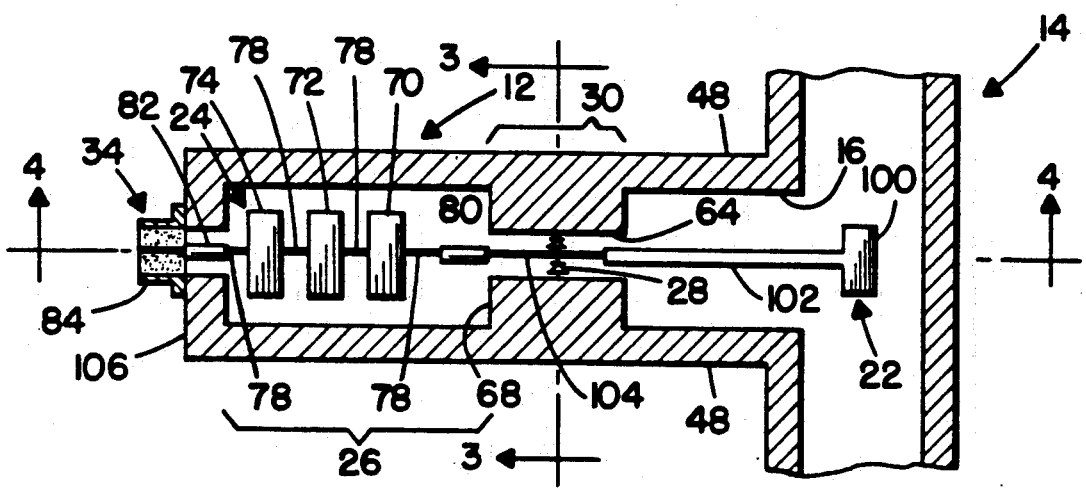
FIG. 2 is a sectional view of the mixer of FIG. 1 taken along the line 2—2 in FIG. 4, portions of the figure including mixing diodes being indicated diagrammatically.
Figure 3:
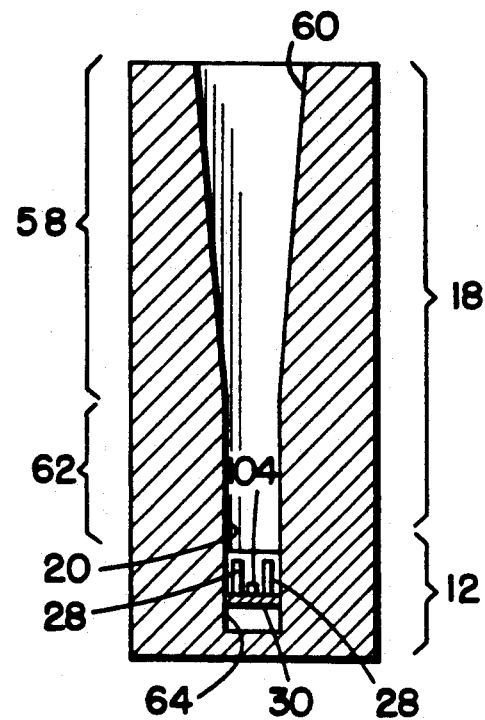
FIG. 3 is a sectional view of an RF-input waveguide of the mixer taken along the line 3—3 in FIGS. 1 and 2.
Figure 4:
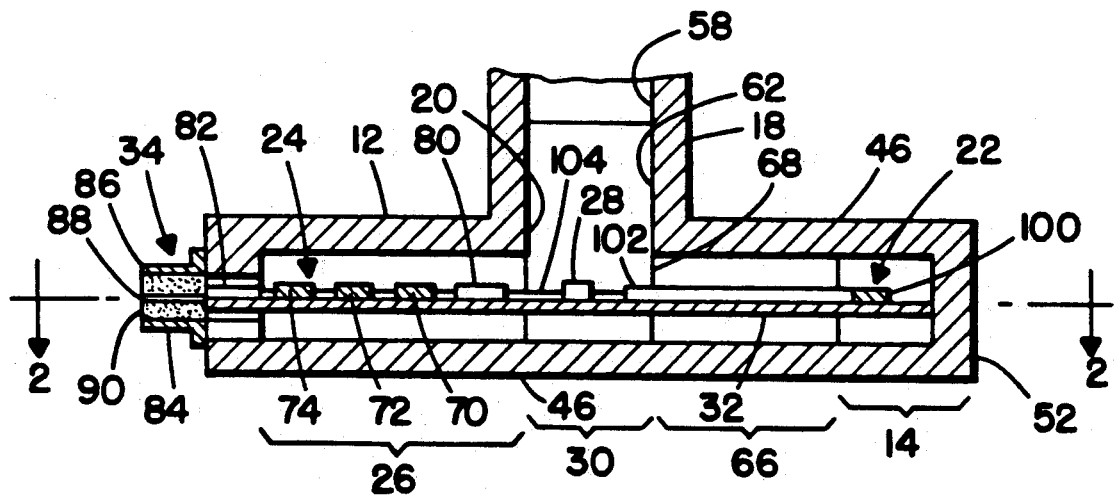
FIG. 4 is a sectional view of the mixer taken along the line 4—4 in FIG. 2.

With reference to FIG. 1, a mixer 10 is constructed in accordance with the invention, and includes a first waveguide 12, a second waveguide 14 abutting an end of the first waveguide 12 at a first input port 16 of the first waveguide 10, and a third waveguide 18 abutting a side of the first waveguide 12 at a second input port 20 of the first waveguide 12. Essential components of the mixer 10 are indicated in phantom view and in cut-away view in FIG. 1, with further details of the components being disclosed in the sectional views of FIGS. 2-4. These components include an input probe 22 in the first input port 16 for coupling microwave power from the second waveguide 14 to the first waveguide 12, a filter 24 located in an output section 26 of the first waveguide 12, and two mixing diodes 28 located in a mixing section 30 of the first waveguide 12 between the probe 22 and the filter 24. The probe 22, the diodes 28, and components of the filter 24 (to be disclosed hereinafter) are supported by a plate 32 of dielectric electrically-insulating material disposed parallel to a broad wall of the first waveguide 12 and approximately at a central plane of the first waveguide 12. Flanges used in interconnecting the three waveguides 12, 14 and 18 in accordance with well-known construction practice have been deleted for simplicity in portraying the mixer 10. It is understood that other modes of fabrication may be employed such as a brazing together of the waveguides or a molding of the entire assembly of the mixer 10.

In accordance with the theory of the invention, two microwave signals of different frequencies are inputted to the mixer 10 via the second waveguide 14 and the third waveguide 18 to interact in the mixing section 30, via a well-known nonlinear fashion with the diodes 28, to produce signals at other frequencies. The signals at the other frequencies include an IF signal wherein the intermediate frequency is typically an order of magnitude less than the frequencies of the inputted microwave signals. A further frequency produced by the nonlinear interaction is an image-frequency signal. In the practice of the invention, the two inputted microwave signals include an RF input signal and a reference LO input signal. In the preferred embodiment of the invention, by way of example, the RF input signal has a frequency of 67 GHz (gigahertz), and the reference LO input signal has a frequency of 61 GHz. The intermediate frequency has a value of 6 GHz which is equal to the difference between the RF and LO signal frequencies. The frequency of the image signal is 55 GHz which is equal to 2(LO) - RF, namely, the difference of twice the LO signal frequency minus the RF signal frequency. In accordance with the invention, the filter 24 has a passband centered at the intermediate frequency, 6 GHz, for passing the IF signal from the mixing section 30 to an output port 34 of the first waveguide 12. The filter 24 reflects signals at the image signal frequency back to the mixing section 30 for interaction via the diodes 28 with the reference LO signal. Interaction of the reflected image signal with the reference signal produces additional signal at the intermediate frequency in phase with the originally produced IF signal. For example, Interaction of the image signal at 55 GHz with the LO signal at 61 GHz produces a signal at a frequency of 6 GHz which is the difference between the LO signal frequency and the image signal frequency. Thereby, the invention provides for more IF power and improved SNR.

By way of example in the use of the mixer 10, the third waveguide 18 may be connected to an antenna 36 for receipt of a microwave RF signal, a first end of the second waveguide 14 may be coupled to a local oscillator 38 for receipt of the reference LO signal, and a receiver 40 may be coupled to the output port 34 for receipt of the IF signal. A sliding end wall, or shorting wall 42, is disposed in a second end of the second waveguide 14, and is adjusted in position by a positioning mechanism 44 for tuning the second waveguide 14 and its connection to the first input port 16 for maximizing power flow of the LO signal into the mixing section 30.

With reference to FIGS. 1-4, each of the waveguides 12, and 14 is fabricated, in a preferred embodiment of the invention, of a metal such as brass or aluminum, and is provided with a rectangular cross-section in which the interior dimension, or width, of a broad wall is twice the interior dimension, or height, of a sidewall. The first waveguide 12 has broad walls 46 and sidewalls 48. The second waveguide 14 has broad walls 50 and sidewalls 52. The third waveguide 18 is constructed of the same material as the other waveguides 12 and 14, and is provided with a cross-section of varying dimensions. The third waveguide 18 has a broad wall 54 of constant width, and a sidewall 56 of varying height to provide for a tapered section 58 which acts as an impedance transformer for matching the impedance of an input end 60 of the waveguide 18 to a reduced-height section 62, the reduced height section 62 terminating at the second input port 20.

The mixing section 30 of the first waveguide 12 has a reduced width defining a channel 64 for matching the impedance of an input section 66 of the first waveguide 12 to the impedance presented by the two mixing diodes 28. The width of the channel 64, as measured in a plane parallel to a broad wall 46 of the first waveguide 12 is equal to the height of the reduced height section 62 as measured in a plane parallel to the sidewall 56 of the third waveguide 18. Thereby, the impedance of the mixing diodes 28 is matched to both the channel 64 of the first waveguide 12 and to the reduced-height section 62 of the third waveguide 18. The channel 64 in the first waveguide 12 is defined by a pair of abutments 68 extending inwardly from the sidewalls 48.

The filter 24 comprises a set of three resonators 70, 72, and 74 supported on the plate 32 and located serially along a central axis 76 (FIG. 1) of the first waveguide 12. The resonators 70, 72, and 74 are fabricated as metal blocks and are spaced apart from each other and are connected electrically by metallic strips 78. Tuning elements 80 and 82 having the form of elongated cylindrical metal slugs are disposed on opposite ends of the series of resonators, the tuning element 80 being connected by a metallic strip 78 to the resonator 70, and the tuning element 82 being connected by a further metallic strip 78 to the resonator 74. The metallic strips 78 and the tuning elements 80 and 82 are disposed also along the axis 76. The tuning element 82 extends into the output port 34, the output port 34 including a connector 84 to enable connection of a coaxial transmission line (not shown) to the output port 34. The connector 84 may be constructed in the customary fashion including an outer metallic shell 86 which surrounds a central metallic conductor 88, and includes an annular dielectric slug 90 disposed between the central conductor 88 and the shell 86.

The probe 22 comprises a bulb 100 located within the second waveguide 14, and a rod 102 disposed along the axis 76 and extending from the bulb 100 through the input section 66 to connect via a metallic strip 104 with the tuning element 80. The metallic strip 104 also connects with a junction of the two diodes 28. The tuning elements 80 and 82, the metallic strip 78, and the strip 104 are supported by the plate 32. The rod 102 and the bulb 100 of the probe 22 are formed of a metal such as brass or aluminum. The configuration of the probe 22, including the rod 102 and the bulb 100 aids in coupling the reference LO signal from the second waveguide 14 into the first waveguide 12 for interaction with the diodes 28. The output port 34 is formed as a cylindrical passage in an end wall 106 of the first waveguide 12, the end wall 106 in cooperation with the abutments 68, the broad walls 46 and the sidewalls 48 defining a cavity which encloses the resonators 70, 72, and 74 to aid in establishing the desired characteristics of the filter 24. The second waveguide 14 supports a transverse electric (TE) wave, and the third waveguide 18 also supports a TE wave with the electric field, in each of the waveguides 14 and 18, extending perpendicularly to the broad walls.

The broad walls 50 of the second waveguide 14 are coplanar with the corresponding broad walls 46 of the first waveguide 12. In the operation of the diodes 28, it is noted that the diodes 28 act as detectors of the LO signal and, upon a detection of the LO signal, develop a DC bias voltage. The RF input signal is of lower amplitude than the LO signal and interacts with the LO signal in a nonlinear region of the current-voltage characteristic of the diode 28 to produce signals at a plurality of harmonic frequencies including the IF signal and the image signal. In the case of the RF and the LO signals having the aforementioned frequencies of 67 and 61 GHz, respectively, the mixer 10 has been found to be operative over a bandwidth of 2 GHz for producing the increased output power of IF signal. The cross-sectional dimensions of the first waveguide 12 and of the second waveguide 14, for the foregoing frequencies of operation, are 148 mils by 74 mils. Each of the diodes 28 has an impedance of 100 ohms, the two diodes 28 being connected in series across the channel 64 to provide a combined impedance of 200 ohms which is presented to the RF and to the LO signals. The coplanar and perpendicular relationship between the second waveguide 14 and the first waveguide 12, and the perpendicular relationship of the third waveguide 18 to the common plane of both the first waveguide 12 and the second waveguide 14 provides for an orthogonal relationship of the LO and the RF signals for isolation of these two signals from each other, and from the resulting IF signal.

In operation, the reference LO signal propagates via the second waveguide 14 to the probe 22, whereupon the reference signal is coupled via the probe 22 into the first waveguide 12 and into the mixing section 30 for interaction with the diodes 28. The RF signal is inputted via the third waveguide 18 to impinge upon the diodes 28 in the channel 64 to interact with the diodes 28. The plate 32 is parallel to the broad walls 46 of the first waveguide 12, and supports the diodes 28 at a position for interaction with both the RF input signal and the reference LO signal to produce the IF signal and an image signal. The sizes and spacings of the resonators 70, 72, and 74 are selected in accordance with well known practice to provide a pass band for the IF signal for communicating the IF signal from the mixing section 30 to the output port 34. It is noted that the construction of the microwave circuit including the rod 102, the strip 104, the tuning elements 80 and 82, the strip 78 and the resonators 70, 72, and 74 within the enclosing metallic, electrically-conductive structure of the broad walls 46 and the sidewalls 48 constitute a structure which supports a transverse electromagnetic (TEM) wave. Thus, all frequencies of interest can propagate along the microwave structure in the TEM mode. However, the filter 24 is transmissive at a passband centered at the intermediate frequency, and reflects signal at other frequencies, in particular, the image frequency. The cross-sectional dimensions of the reduced-height section 62 of the third waveguide 18 provide the characteristics of a waveguide below cutoff frequency for both the IF signal and the image signal. Therefore, other than by propagation in an evanescent mode with severe attenuation, there is essentially no propagation of the IF and the image signals from the mixing section 30 through the third waveguide 18. Thus, the image signal is substantially trapped in the microwave structure and is reflected back to the diodes 28 for further interaction with the reference LO signal to produce still more signal at the intermediate frequency. By a positioning of the shorting wall, the microwave structure is tuned to provide a cophasal relationship between the originally produced IF signal and the additional production of signal at the intermediate frequency upon interaction of the image signal with the reference signal. Thereby, the mixer 10 produces significantly more power at the IF signal outputted from the output port 34 with significantly increased signal-to-noise ratio than has been possible heretofore.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. An electromagnetic wave mixer comprising:
   a first elongated waveguide having a first end with a first input port a second input port, a second end opposite the first end with an output port, a mixing region and a filter coupled to the mixing region;
   a second elongated waveguide coupled to the first waveguide for applying a reference signal to the first waveguide mixing region via the first input port, the second waveguide having an elongated sidewall abutting the first end of the first waveguide; and
   a third elongated waveguide coupled to the first waveguide for applying an RF signal to the first waveguide mixing region via the second input port of the first waveguide, so that the RF signal and the reference signal interact to produce harmonics including an IF signal and an image signal;
   wherein the axes of elongation of the three waveguides are orthogonally disposed relative to each other and wherein the filter passes the IF signal to the output port of the first waveguide, and reflects the image signal back to the mixing region of the first waveguide for interaction with the reference signal to generate an increased amount of the IF signal.

2. A mixer according to claim 1 wherein each of the waveguides has a rectangular cross section defined by opposing broad walls and opposing sidewalls adjacent the broad walls and wherein the broad walls are wider than the sidewalls.

3. A mixer according to claim 2 wherein one of said broad walls of the second waveguide is parallel to one of said broad walls of the first waveguide.

4. A mixer according to claim 2 wherein a proximal end of the of the third waveguide abuts one of said broad walls of the first waveguide at the second input port of the first waveguide.

5. A mixer according to claim 4 wherein the proximal end of the third waveguide includes a waveguide section of reduced height, and a taper extending from the reduced-height section toward a distal end of the third waveguide, the reduced-height section acting as a waveguide below cutoff to the IF signal and the image signal for providing an evanescent transmission mode to the IF and image signals while allowing the RF signal to propagate through the reduced-height section to the mixing region.

6. A mixer according to claim 1 wherein the IF signal has a frequency equal to the difference between the frequencies of the RF input signal and the reference signal, and wherein the image signal has a frequency equal to twice the frequency of the reference signal minus the frequency of the RF input signal.

7. A mixer according to claim 5 wherein the second and third waveguides support a transverse electric (TE) wave.

8. A mixer according to claim 1 wherein:
the first input port includes a coupling probe extending from the second waveguide to the mixing region;
the filter comprises a series of resonators disposed along a central axis of the first waveguide;
the mixing region comprises at least one diode; and
the first waveguide includes a central conductor interconnecting the probe, the at least one diode and the resonators of the filter supporting a transverse electromagnetic (TEM) wave.

9. A mixer according to claim 6 wherein the second and third waveguides support a transverse electric (TE) wave.

* * * * *